(12) United States Patent
Watanabe et al.

(10) Patent No.: US 8,150,648 B2
(45) Date of Patent: Apr. 3, 2012

(54) TIMING GENERATOR

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 637 days.

(21) Appl. No.: 12/344,424

(22) Filed: Dec. 26, 2008

(65) Prior Publication Data
US 2010/0164584 A1 Jul. 1, 2010

(51) Int. Cl.
*H03H 11/26* (2006.01)
(52) U.S. Cl. ......... 702/125; 713/500; 713/501; 713/502
(58) Field of Classification Search .................. 702/125; 714/738, 740, 744; 327/251; 331/45; 713/500–502
See application file for complete search history.

(56) References Cited

U.S. PATENT DOCUMENTS

| 5,903,745 A * | 5/1999 | Nakayama et al. | 713/500 |
| 2002/0178409 A1* | 11/2002 | Ostendorf | 714/703 |

FOREIGN PATENT DOCUMENTS

| JP | 08-320360 | 3/1996 |
| JP | 10-319097 | 4/1998 |
| JP | 11-153654 | 8/1999 |
| JP | 11-1536554 | 8/1999 |
| JP | 2001-124835 | 11/2001 |
| JP | 2006-226791 | 8/2006 |

* cited by examiner

*Primary Examiner* — Drew A Dunn
*Assistant Examiner* — Hien Vo
(74) *Attorney, Agent, or Firm* — Martine Penilla Group, LLP

(57) ABSTRACT

A delay setting data generator generates delay setting data based on rate data. A variable delay circuit delays the test pattern data by a delay time determined by the delay setting data with reference to a predefined unit amount of delay. First rate data designates the period of the test pattern data with a precision determined by the unit amount of delay. Second rate data designates the period of the test pattern data with a precision higher than that determined by the unit amount of delay. The delay setting data generator outputs a first value and a second value in a time division manner at a ratio determined by the second rate data, the first and second values being determined by the first rate data.

10 Claims, 3 Drawing Sheets

12a

12b

12c

TIMING GENERATOR

BACKGROUND OF THE INVENTION

1. Field of the Invention

The present invention relates to a technology for testing semiconductor devices and, more particularly, to a technology of controlling the period (test rate) of a test pattern.

2. Description of the Related Art

A test apparatus is used to supply a test pattern to a device under test (DUT) so as to determine whether the device is defective or not by inspecting its operation. A pattern generator (PG) for generating a test pattern to be supplied to a DUT and a timing generator (TG) for defining the timing of supplying a test pattern to a DUT are installed in a test apparatus. The period (frequency) of a test pattern is alternatively referred to as a test rate. A test apparatus is required to provide the function of altering a test rate arbitrarily.

Timing generators are broadly categorized into two types according to the method of operation.

The first method uses a phase lock loop (PLL). Specifically, a PLL circuit is used to multiply a reference clock and the timing of a test pattern is controlled in synchronization with the multiplied signal. The PLL method allows setting a test rate arbitrarily by switching the frequency division ratio of the PLL circuit. Hereinafter, this method will also be referred to as the PLL method.

The second method uses a variable delay circuit. This method achieves an arbitrary test rate by setting the amount of delay of a variable delay circuit according to a test rate and delay the test pattern accordingly. Alternatively a variable delay circuit introduces an arbitrary delay in a set signal and a reset signal defining the timing of transition of a test pattern so that a test pattern is caused to make a transition in synchronization with the set signal and the reset signal thus delayed. This method will also be referred to as a phase accumulation (PA) method.

Semiconductor devices available today operate at increasingly higher speeds. Higher speeds of devices mean higher test rates. In the near future, a test apparatus will be required to control a test rate with an extremely high resolution on the order of sub-picoseconds (ps).

For high resolution control of a test rate in a PLL-based timing generator, either (1) the pulse swallow method or (2) $\Delta\Sigma$ fractional N-PLL method is employed. The pulse swallow method has an advantage in that the design is easy but has a disadvantage in that there are some frequency division ratios that cannot be set (i.e., test rates that cannot be set). Meanwhile, the $\Delta\Sigma$ fractional N-PLL method has an advantage in that arbitrary frequency division ratios (test rates) can be achieved but has a disadvantage in that fractional spurious is generated. Providing a $\Delta\Sigma$ noise shaper to eliminate fractional spurious will cause another problem in that phase noise is increased. Still another problem is that spurious signals will be increased at a specific frequency division ratio.

A test apparatus targeting memory devices and some non-memory devices is sometimes required to change the test rate from moment to moment on a real time basis. Such a control is sometimes referred to as real time timing control (RTTC) or on the fly control. In principle, on the fly control using a PLL-based timing generator is impossible because of a settling time (lock up time) required to elapse until the PLL produces oscillation at a preset period.

Meanwhile, switching of the test rate in a PA-based timing generator is none other than switching of the amount of delay of the variable delay circuit. Since the switching of the amount of delay of the variable delay circuit only requires a very short time, the PA method is employed for on the fly control of the test rate.

The resolution of the test rate of the PA-based timing generator corresponds to the resolution of the amount of delay of the variable delay circuit. Variable delay circuits currently available provide a resolution of one to several ps. To obtain a higher resolution (e.g., sub ps), a dramatic increase in hardware scale would be required or it would be almost impossible to design such a circuit.

SUMMARY OF THE INVENTION

In this background, an illustrative purpose of the present invention is to provide a technology capable of controlling the test rate of a timing generator with a high resolution.

One embodiment of the present invention relates to a timing generator adapted to receive test pattern data to be supplied to a device under test and rate data for setting the period of the test pattern data, and control the timing of outputting the test pattern data to the device under test according to the rate data. The timing generator comprises: a delay setting data generator operative to receive the rate data and generate delay setting data; and a variable delay circuit operative to delay the test pattern data by a delay time determined by the delay setting data with reference to a predefined unit amount of delay. The rate data comprises first rate data designating the period of the test pattern data with a precision determined by the unit amount of delay and second rate data designating the period of the test pattern data with a precision higher than that determined by the unit amount of delay. The delay setting data generator is operative to output a first value and a second value in a time division manner at a ratio determined by the second rate data, the first value being determined by the first rate data and the second value being determined by the first rate data and different from the first value.

The phrase "delay the test pattern" encompasses delaying at least one of a signal indicating a positive edge of the test pattern and a signal indicating a negative edge of the test pattern as well as delaying the test pattern itself. The phrase broadly encompasses any measures for delaying a signal that affects the timing of the test pattern data.

According to this embodiment, the test rate can be controlled with a resolution higher than the resolution of the variable delay circuit, by using the first and second values and the frequencies of their occurrence.

The delay setting data generator may generate a serial data sequence in which 0s and 1s occur at frequencies determined by the second rate data, add the bits of the serial data sequence to the first rate data or subtract the bits of the serial data sequence from the first rate data, and output the resultant data as the delay setting data.

In this case, the first and second values may be set to the first rate data itself and data derived from adding 1 to the first rate data. The ratio of the first and second values may be set according to the second rate.

The delay setting data generator may include a pseudorandom data generator capable of controlling the mark-to-space ratio according to the second rate data, and use the output from the pseudorandom data generator as the serial data sequence.

In this case, deviation of the test rate over time is reduced by using the pseudorandom data generator.

The delay setting data generator may include an nth-order $\Delta\Sigma$ modulator for subjecting the second rate data to $\Delta\Sigma$ modulation, where n is a natural number, add the sequence of ith-order bits of the second rate data DRATE2 thus modulated to the ith bits in the lower group of bits in the first rate data, respectively, or subtract the ith-order bits from the ith bits, respectively, where $1 \leq i \leq n$, and outputs the resultant data as the delay setting data.

In this case, deviation of the test rate over time is further reduced.

The delay setting data generator may further comprise an integrator operable to integrate the first rate data at intervals defined by a first clock. Given that division of the data output from the integrator by a reference value determined by the period of the first clock produces a quotient α and a remainder β, where α and β denote integers, the delay setting data generator may set the first value and the second value to values determined by the remainder β. The timing generator may delay the test pattern data by a total of α periods of the first clock.

Another embodiment of the present invention relates to a test apparatus. The test apparatus comprises: a pattern generator operative to produce test pattern data to be supplied to a device under test; and the timing generator according to any of the embodiments described above operable to control the timing of outputting the test pattern data to the device under test according to rate data.

Still another embodiment of the present invention relates to a method of controlling a test rate at which test pattern data is output to a device under test, based on rate data for setting the period of the test pattern data to be supplied to the device under test. The rate data comprises first rate data designating the period of the test pattern data with a precision determined by the unit amount of delay and second rate data designating the period of the test pattern data with a precision higher than that determined by the unit amount of delay. The method comprises: setting delay setting data to be a first value and a second value in a time division manner at a ratio determined by the second rate data, the first value being determined by the first rate data and the second value being determined by the first rate data and different from the first value; and delaying the test pattern data by a delay time determined by the delay setting data with reference to a predefined unit amount of delay.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. In the same Way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
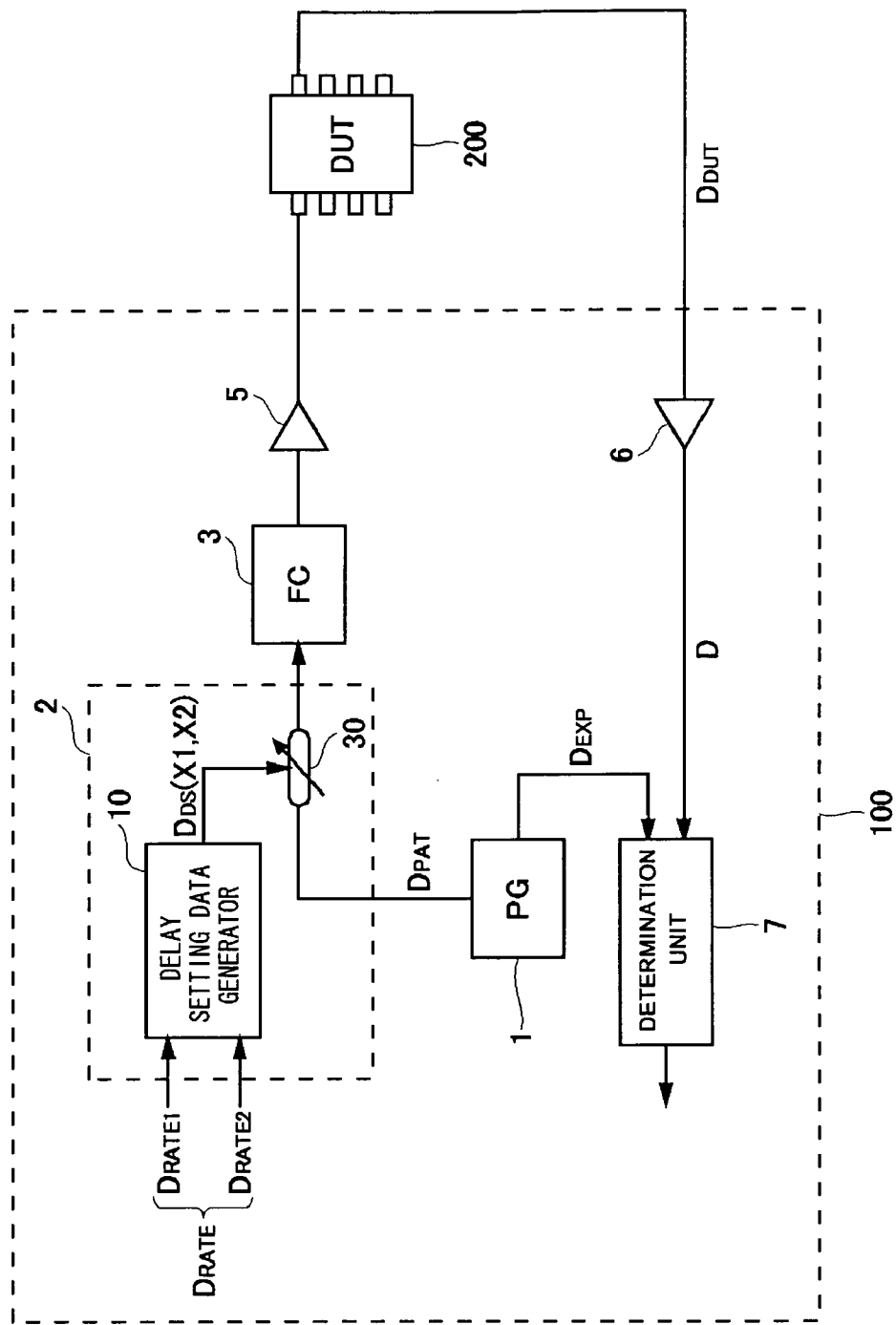
FIG. 1 shows the structure of a test apparatus according to an embodiment.

FIG. 1 shows the structure of a test apparatus 100 according to an embodiment. The test apparatus 100 is provided with a pattern generator (PG) 1, a timing generator (TG) 2, a form shaper (FC) 3, a driver 5, a comparator 6, and a determination unit 7.

The pattern generator 1 generates test pattern data $D_{PAT}$ that should be supplied to a DUT 200. The test pattern data $D_{PAT}$, when output from the pattern generator 1 as parallel data, is converted into a serial bit series by a data serializer.

The test apparatus 100 is provided with the function of arbitrarily setting the period of the test pattern data $D_{PAT}$ according to a command or program set by the user. The timing generator 2 receives the test pattern data $D_{PAT}$ and rate data $D_{RATE}$ for setting the period of the test pattern data $D_{PAT}$. The timing generator 2 controls the timing of outputting the test pattern data $D_{PAT}$ to the DUT according to the rate data $D_{RATE}$.

The form shaper 3 receives the test pattern data $D_{PAT}$ subjected to timing control by the timing generator 2 and sets the data $D_{PAT}$ to have a data format suitable for the DUT 200. The form shaper 3 is also referred to as a format controller (FC) because of its function.

The driver 5 supplies the test pattern output from the form shaper 3 to the DUT 200. For example, in case the DUT 200 is a memory, the test pattern is written in a designated address. The test pattern, once written, is read out again. If the DUT 200 is not defective, the written pattern and the read pattern should match. The level of the pattern read from the memory is determined by the comparator 6 so as to produce device data $D_{DUT}$. The pattern generator 1 generates expectation data $D_{EXP}$ such that the timing of generation is set by the user. The determination unit 7 determines whether the device data $D_{DUT}$ and the expectation data $D_{EXP}$ match, identifies non-defective DUT 200, and may identify a defective location.

Described above is the overall structure of the test apparatus 100. A detailed description will now be given of the structure of the timing generator 2 according to the embodiment.

The timing generator 2 is of phase accumulation type and is primarily provided with a delay setting data generator 10 and a variable delay circuit 30. The delay setting data generator 10 receives the rate data $D_{RATE}$ and generates delay setting data $D_{DS}$.

The variable delay circuit 30 is a delay circuit operating with reference to a predefined unit amount of delay τu. For example, the circuit 30 includes a plurality of unit delay elements (buffers) in cascade connection. The structure of the variable delay circuit 30 is not limited to the one described above. Various delay circuits capable of digital control of the amount of delay may be used.

The variable delay circuit 30 delays the test pattern data $D_{PAT}$ by a delay time τ defined by the delay setting data $D_{DS}$ with reference to the unit amount of delay τu. For example, the amount of delay τ of the variable delay circuit 30 is set to a value derived by multiplying the unit amount of delay τu by the delay setting data $D_{DS}$. The unit amount of delay τu is between one to several ps. In the following description, it is assumed that τu=1 ps for ease of understanding and brevity.

Figure 2:
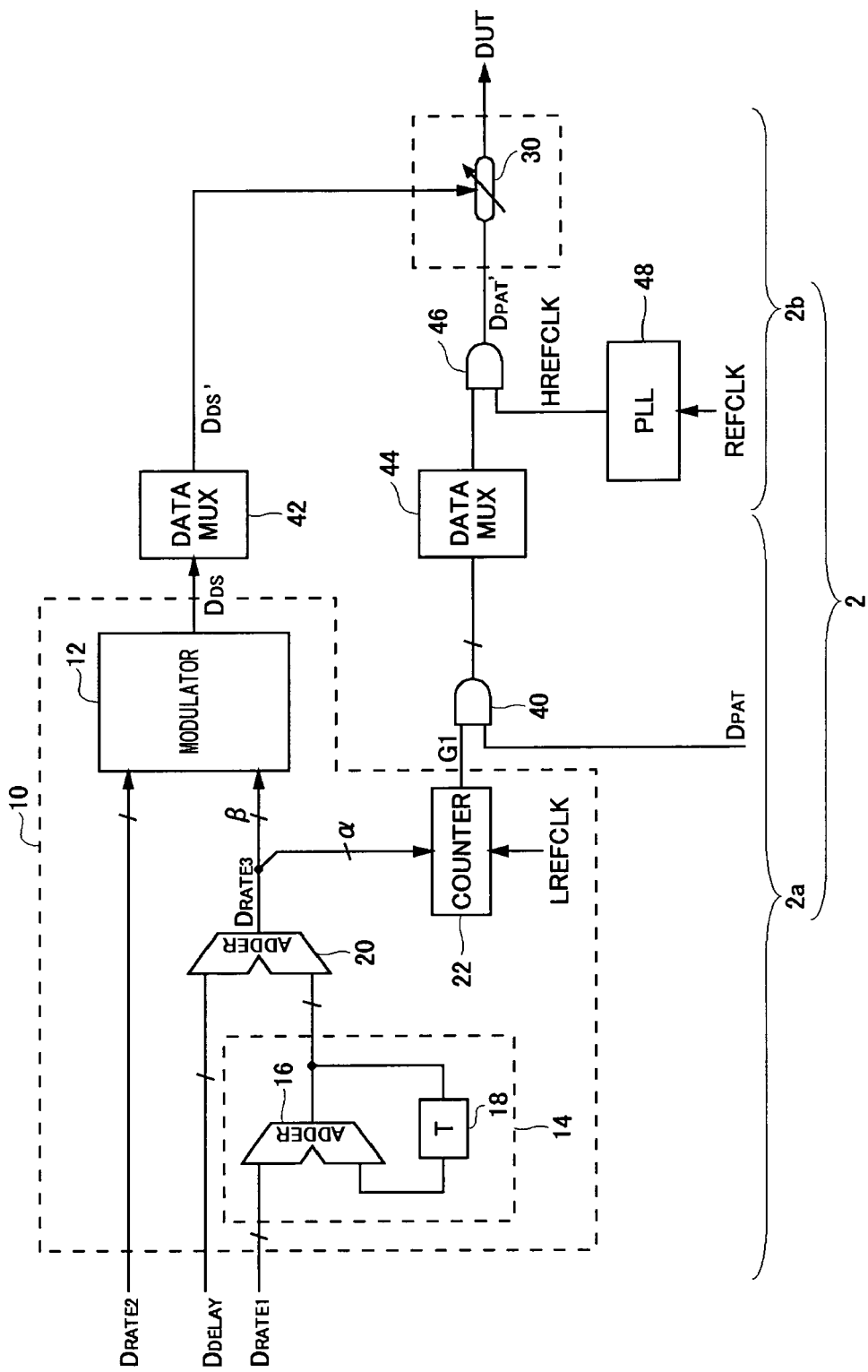
FIG. 2 shows an exemplary structure of the timing generator of FIG. 1.

While FIGS. 1 and 2 illustrate the variable delay circuit 30 as delaying the test pattern data $D_{PAT}$ itself, this does not limit the scope of the present invention. For example, the variable delay circuit 30 may equivalently delay edge signals (also referred to as a set signal and a reset signal) that designate the timing of edges (a positive edge and a negative edge) of level transition of the test pattern data $D_{PAT}$. In this case, an RS flip-flop set and reset by a set signal and a reset signal, respectively, is provided in addition to the variable delay circuit 30. Any publicly known technology may be employed to achieve such a structure in the present invention.

The rate data $D_{RATE}$ fed to the timing generator 2 includes first rate data $D_{RATE1}$ and second rate data $D_{RATE2}$. The first rate data $D_{RATE1}$ designates the period of the test pattern $D_{PAT}$ (test rate) with a precision of the unit amount of delay τu. The second rate data $D_{RATE2}$ designates the period of the test pattern with a precision higher than the unit amount of delay τu, i.e., with a sub-picosecond resolution τf. The first rate data $D_{RATE1}$ and the second rate data $D_{RATE2}$ may be a higher group of bits and a lower group of bits, respectively, which form a series of bits $D_{RATE}$. Alternatively, $D_{RATE1}$ and $D_{RATE2}$ may be separate data.

The delay setting data generator 10 sets the delay setting data $D_{DS}$ to one of the first value X1 and the second value X2. The first value X1 is determined by the first rate data $D_{RATE1}$. The second value X2 is determined by the first rate data $D_{RATE1}$ and is different from the first value X1.

The first value X1 and second value X2 may be set in any appropriate manner. For example, the values may be set according to expressions (1) and (2) below.

$$X1 = D_{RATE1} + \delta 1 \quad (1)$$

$$X2 = D_{RATE1} + \delta 2 \quad (1)$$

where δ1 and δ2 are different integers and may be zero or negative values.

The delay setting data generator 10 outputs, as the delay setting data $D_{DS}$, the first value X and second value X2 in a time-division manner at a ratio (Y1:Y2) determined by the second rate data $D_{RATE2}$. Y1 denotes the statistical probability that the delay setting data $D_{DS}$ takes the first value X1, and Y2 denotes the statistical probability that the data $D_{DS}$ takes the second value X2, where the following expression holds.

$$Y1 + Y2 = 1 \quad (3)$$

In this case, the amount of delay applied by the variable delay circuit 30 to the test pattern data $D_{PAT}$ as average over time will be given by the following expression.

$$\tau = \tau u \times (X1 \times Y1 + X2 \times Y2) \quad (4)$$

Substituting expressions (1)-(3) into expression (4), we obtain the following expression.

$$\begin{aligned}\tau &= \tau u \times \{(D_{RATE1} + \delta 1) \times Y1 + (D_{RATE1} + \delta 2) \times Y2\} \\ &= \tau u \times D_{RATE1} \times (Y1 + Y2) + \tau u \times (\delta 1 \times Y1 + \delta 2 \times Y2) \\ &= \tau u \times D_{RATE1} + \tau u \times (\delta 1 \times Y1 + \delta 2 \times Y2)\end{aligned} \quad (5)$$

For example, given that δ1=0 and δ2=1, expression (5) may be written as follows.

$$\tau = \tau u \times D_{RATE1} + \tau u \times Y2 \quad (5a)$$

For example, to obtain a test rate τ=10.1 ps, the following setting may be used.

$$D_{RATE1} = 10$$

$$\tau u = 1 \text{ ps}$$

$$Y2 = 0.1$$

Described above is the structure and operating principle of the timing generator 2 according to the embodiment. The value of the second term (δ1×Y1+δ2×Y2) on the right side of expression (5) may be a non-integral value, i.e., may be a fraction or decimal fraction. The value varies in accordance with the second rate data $D_{RATE2}$. Accordingly, the timing generator 2 according to the embodiment is capable of controlling the amount of delay τ given by expression (5) with a resolution higher than the unit amount of delay τu.

A description will now be given of a specific, exemplary structure of the timing generator 2. FIG. 2 is a circuit diagram showing an exemplary structure of the timing generator of FIG. 1.

The timing generator 2 is provided with a delay setting data generator 10, a variable delay circuit 30, a first multiplexer 42, a second multiplexer 44, a second AND gate 46, and a frequency multiplier 48. The timing generator 2 comprises two blocks including a logic unit 2a operating in synchronization with the first clock LREFCLK having the first frequency f1 and an analog unit 2b operating in synchronization with the second clock HREFCLK having a frequency higher than the first frequency f1.

For example, a reference clock REFCLK from an external source is used as the first clock LREFCLK. The second clock HREFCLK is generated by multiplying the reference clock REFCLK using the frequency multiplier 48. The frequency multiplier 48 may be a PLL circuit or DLL (delay locked loop). Hereinafter, it will be assumed that f2=8×f1 for brevity and ease of understanding.

As described above, the timing generator 2 uses the PA method.

The delay setting data generator 10 is provided with a modulator 12, an integrator 14, a second adder 20, and a counter 22.

The integrator 14, the second adder 20, and the counter 22 perform a signal process according to the PA method. The integrator 14 integrates the first rate data $D_{RATE1}$ at intervals defined by the first clock LREFCLK.

For example, the integrator 14 includes a first adder 16 and a delay circuit 18. The delay circuit 18 delays the data output from the first adder 16 by the period of the first clock LREFCLK. The first adder 16 adds the first rate data $D_{RATE1}$ and the data output from the first adder 16 delayed by a single period.

More specifically, given that the value 4 is continuously input as the first rate data $D_{RATE1}$, the output $D_{RATE1}'$ of the integrator 14 will be increased such that 4, 8, 12, 16, … In practice, signal processing is performed using the binary format instead of decimal numbers.

The second adder 20 adds the data output from the integrator 14 and delay data $D_{DELAY}$. The delay data $D_{DELAY}$ is set so as to delay the data output to the DUT by a predefined period of time irrespective of the test rate.

The second adder 20 outputs data $D_{RATE3}$ (hereinafter, referred to as cumulative data) determined by the first rate data $D_{RATE1}$ as integrated over time.

The cumulative data $D_{RATE3}$ is divided by a reference value T1 determined by the period of the first clock LREFCLK so as to produce a quotient α and a remainder β.

Preferably, the reference value T1 is a factorial of 2, i.e., $T1=2^p$, where p denotes a natural number. In this case, a divider is not necessary since division is equivalent to a bit shift. The lower p bits of the cumulative data $D_{RATE3}$ represent a remainder and the remaining higher bits represent a quotient α. A divider may be provided separately.

The quotient data α is fed to the counter 22. The counter 22 counts the first clock LREFCLK and raises a gate signal G1 to a high level each time the count reaches α. A first AND gate 40 uses the gate signal G1 to gate the test pattern data $D_{PAT}$. This process delays the test pattern data $D_{PAT}$ by a total of α periods of the first clock LREFCLK.

The remainder data β is fed to the modulator 12. The remainder data β is data determined by the first rate data $D_{RATE1}$.

The modulator 12 outputs, as the delay setting data $D_{DS}$, the first value X1 determined by the remainder β (the first rate data $D_{RATE1}$) and the second value X2 determined by the remainder data β in a time-division manner at a ratio determined by the second rate data $D_{RATE2}$. Such a process can be understood as a sort of modulation.

The first multiplexer 42 subjects the delay setting data $D_{DS}$ output from the modulator 12 to parallel-to-serial conversion. Similarly, the second multiplexer 44 subjects the data output from the first AND gate 40 to parallel-to-serial conversion. The second AND gate 46 gates (re-times) the data output from the second multiplexer 44 according to the second clock HREFCLK. The variable delay circuit 30 delays the test pattern data $D_{PAT}$' output from the second AND gate 46 according to the delay setting data $D_{DS}$' output from the first multiplexer 42.

Figure 3:
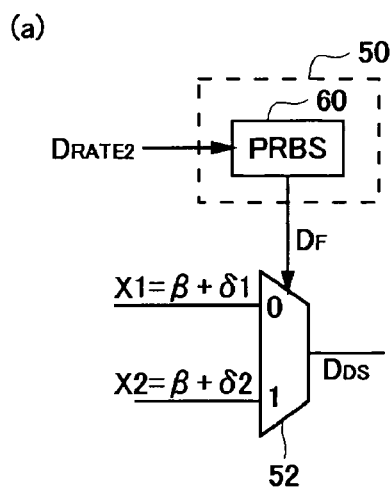
FIGS. 3A-3C show exemplary structures of a modulator.
Figure 3:
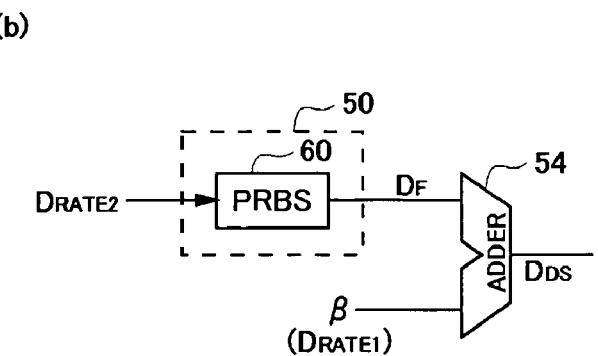
Figure 3:
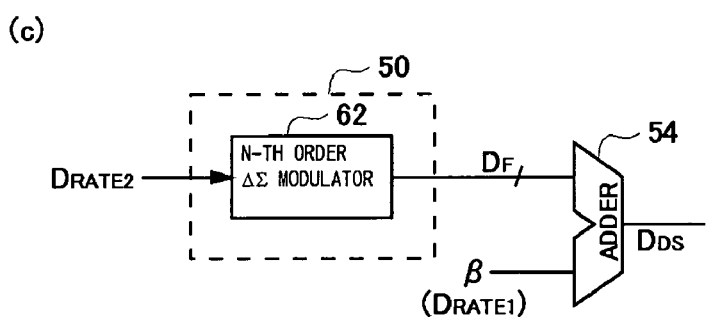

A description will now be given of the modulator 12. FIGS. 3A-3C show an exemplary structure of the modulator 12.

A modulator 12a of FIG. 3A is provided with a high resolution data generator 50 and a selector 52. The first value X1 (=β+δ1) and the second value X2 (=β+δ2) are fed to the selector 52. The high resolution data generator 50 generates serial data (hereinafter, referred to as high resolution data $D_F$) where 1s and 0s occur at the respective frequencies determined by the second rate data $D_{RATE2}$. The selector 52 selects the first value X1 when the high resolution data $D_F$ is at 0 and selects the second value X2 when the high resolution data $D_F$ is at 1. The selector 52 outputs the resultant data as the delay setting data $D_{DS}$. It should be noted that the probability that the delay setting data $D_{DS1}$ takes the value 1 is none other than the probability that the delay setting data $D_{DS}$ takes the second value X2.

The modulator 12b of FIG. 3B includes the high resolution data generator 50 and a third adder 54. The modulator 12b may be suitably used when δ1=0. The high resolution data generator 50 generates high resolution data $D_F$. The third adder 54 adds the remainder data β and the high resolution data $D_F$ and outputs the resultant data as the delay setting data $D_{DS}$. A subtractor may be used in place of the third adder 54. In this case, δ2 is set to a negative value.

The high resolution data $D_F$ may be a bit stream in which 1 bit occurs at a time. In this case, signal processing when δ1=0 and δ2=1 is suitably performed.

Referring to FIGS. 3A and 3B, the high resolution data generator 50 preferably comprises a pseudorandom data (PRBS) generator capable of controlling the mark-to-space ratio according to the second rate data $D_{RATE2}$. By using the pseudorandom data PRBS as the high resolution data $D_F$, deviation of the test rate over time is reduced.

The high resolution data $D_F$ generated by the modulator 12b may be an n-bit parallel bit stream, where n is a natural number. In this case, δ1 is set such that δ1=0 and δ2 can be set to an arbitrary value in the range $0<δ2<2^n$.

In the modulator 12c of FIG. 3C, the high resolution data $D_F$ is an n-bit parallel bit stream, where n is a natural number. The high resolution data generator 50 includes an nth-order ΔΣ modulator 62. The nth-order ΔΣ modulator 62 subjects the second rate data $D_{RATE2}$ to ΔΣ modulation so as to generate the n-bit parallel high resolution data $D_F$. The third adder 54 adds the high resolution data $D_F$ and the remainder data β (the first rate data $D_{RATE1}$) or subtracts the high resolution data $D_F$ from the remainder data β. The modulator 12c generates the delay setting data $D_{DS}$ by adding the sequence of ith-order (1≤i≤n) bits of the second rate data $D_{RATE2}$ thus modulated to the corresponding ith bits of the remainder data β (i.e., the ith bits in the lower group of bits in the first rate data $D_{RATE1}$).

For example, in case a second-order ΔΣ modulator (n=2) is used, the high resolution data $D_F$ output from the n-th order ΔΣ modulator 62 takes one of the values [00], [01], [10], and [11]. The probability of occurrence of the values is set according to the second rate data $D_{RATE2}$. According to this structure, deviation of the test rate over time is suitably reduced further.

Described above is the structure of the timing generator. A description will now be given of the operation.

For ease of understanding, it will be assumed that δ1=0, δ2=1, X1=β, X2=β+1, and $Y2=D_{RATE2}/Z1$. Z1 may be an arbitrary constant number. If the second rate data $D_{RATE2}$ comprises m bits (m is a natural number), Z1 may be such that $Z1=2^m$. In this case, the resolution τf of the test rate based on the second rate data $D_{RATE2}$ is given by $τf=τu/2^m$. The highest bit of the second rate data $D_{RATE2}$ is weighted by a factor τ/2, the second highest bit τ/4, . . . , and the lowest bit $τ/2^m$.

For example, given that τ=1 ps and m=3, the test rate can be controlled with a resolution of τf=0.125 ps. Given that τu=1 ps, m may be set such that m=1 (bit) if the resolution of 0.5 ps is required. If the resolution of 0.25 ps is required, m may be set such that m=2 (bits).

The pseudorandom data generator 60 of FIG. 3A or FIG. 3B deals with successive 8 ($=2^m$) bits as one frame and asserts 1 in a total of ($D_{RATE2}$) bits. For example, given that the first rate data $D_{RATE1}$=[00011] and the second rate data $D_{RATE2}$=[011], Y2=3/8 and Y1=1−Y2=5/8. Therefore, the high resolution data $D_F$ will be random data such as [01010100] and [10010001], where a mark ("1") occurs in 3 of the 8 bits.

Thus, according to the timing generator 2 of the embodiment, the test rate can be set to a fractional value by switching the value of the delay setting data $D_{DS}$ in a time division manner. Switching of the test rate can be made on the fly at every 1 bit (symbol) of the test pattern.

By configuring the timing generator 2 as shown in FIG. 2, the architecture of the related-art timing generator can be inherited so that the load imposed on a circuit designer is significantly reduced. The additional circuitry is concentrated in the logic unit 2a so that full logic implementation is possible. The related-art circuit may be used as it is for the analog unit 2b.

The test rate set by the timing generator 2 takes a central value determined by the rate data $D_{RATE}$ when viewed macroscopically over a long time span. On a microscopic scale, the rate exhibits a random fluctuation. In other words, it looks as if jitter is superimposed on the rate. It should be noted that two components are included in the jitter. More specifically, the first component is derived from jitter in the first clock LREFCLK and the second clock HREFCLK (i.e., jitter inherent in the timing generator), and the second component is fluctuation of the test rate superimposed as a result of transition of the delay setting data $D_{DS}$. It is possible to configure the second component to be substantially equal to or sufficiently smaller than the first component. This means that the test rate can be controlled with a high resolution in a manner that the fluctuation is embedded in the jitter component of the clock inherent in the timing generator 2. It should therefore be appreciated that fractional delay control is guaranteed not to cause adverse effects on test results.

While the preferred embodiments of the present invention have been described using specific terms, such description is for illustrative purposes only, and it is to be understood that changes and variations may be made without departing from the spirit or scope of the appended claims.

What is claimed is:

1. A timing generator adapted to receive test pattern data to be supplied to a device under test and rate data for setting the period of the test pattern data, and control the timing of outputting the test pattern data to the device under test according to the rate data, comprising:
   a delay setting data generator operative to receive the rate data and generate delay setting data; and
   a variable delay circuit operative to delay the test pattern data by a delay time determined by the delay setting data with reference to a predefined unit amount of delay, wherein
   the rate data comprises first rate data designating the period of the test pattern data with a precision determined by the unit amount of delay and second rate data designating the period of the test pattern data with a precision higher than that determined by the unit amount of delay, and
   the delay setting data generator is operative to output a first value and a second value in a time division manner at a ratio determined by the second rate data, the first value being determined by the first rate data and the second value being determined by the first rate data and different from the first value, wherein,
   the delay setting data generator further comprises an integrator operable to integrate the first rate data at intervals defined by a first clock,
   given that division of the data output from the integrator by a reference value determined by the period of the first clock produces a quotient α and a remainder β, where α and β denote integers,
   the delay setting data generator sets the first value and the second value to values determined by the remainder β, and
   the timing generator delays the test pattern data by a total of α periods of the first clock.

2. The timing generator according to claim 1, wherein
the delay setting data generator generates a serial data sequence in which 0s and 1s occur at frequencies determined by the second rate data, adds the bits of the serial data sequence to the first rate data or subtracts the bits of the serial data sequence from the first rate data, and outputs the resultant data as the delay setting data.

3. The timing generator according to claim 2, wherein
the delay setting data generator includes a pseudorandom data generator capable of controlling the mark-to-space ratio according to the second rate data, and uses the output from the pseudorandom data generator as the serial data sequence.

4. The timing generator according to claim 1, wherein
the delay setting data generator includes an nth-order ΔΣ modulator for subjecting the second rate data to ΔΣ modulation, where n is a natural number, adds the sequence of ith-order bits of the second rate data thus modulated to the ith bits in the lower group of bits in the first rate data, respectively, or subtracts the ith-order bits from the ith bits, respectively, where $1 \leq i \leq n$, and outputs the resultant data as the delay setting data.

5. A test apparatus comprising:
   a pattern generator operative to produce test pattern data to be supplied to a device under test; and
   the timing generator according to claim 1 operable to control the timing of outputting the test pattern data to the device under test according to rate data.

6. A method of controlling a test rate at which test pattern data is output to a device under test, based on rate data for setting the period of the test pattern data to be supplied to the device under test, wherein
   the rate data comprises first rate data designating the period of the test pattern data with a precision determined by the unit amount of delay and second rate data designating the period of the test pattern data with a precision higher than that determined by the unit amount of delay, and
   the method comprises:
   integrating the first rate data at intervals defined by a first clock;
   setting delay setting data to be a first value and a second value in a time division manner at a ratio determined by the second rate data, the first value being determined by the first rate data and the second value being determined by the first rate data and different from the first value; and
   delaying the test pattern data by a delay time determined by the delay setting data with reference to a predefined unit amount of delay, wherein,
   given that division of the data obtained by the integrating step by a reference value determined by the period of the first clock produces a quotient α and a remainder β, where α and β denote integers,
   the setting step sets the first value and the second value to values determined according to the remainder β, and
   the method further comprises,
   delaying the test pattern data by a total of α periods of the first clock, wherein at least one of the method operations is executed by logic circuitry.

7. The method according to claim 6, wherein
the setting of the delay setting data comprises:
   generating a serial data sequence in which 0s and 1s occur at frequencies determined by the second rate data; and
   adding the bits of the serial data sequence to the first rate data or subtracting the bits of the serial data sequence from the first rate data, so as to set the delay setting data to be the data resulting from addition or subtraction.

8. The method according to claim 6, wherein
the setting of the delay setting data comprises:
   subjecting the second rate data to n-th order ΔΣ modulation, where n is a natural number, and
   adding the sequence of ith-order bits of the second rate data thus modulated to the ith bits of the first rate data, respectively, or subtracts the ith-order bits from the i-th bits, respectively, where $1 \leq i \leq n$.

9. A timing generator adapted to receive test pattern data to be supplied to a device under test and rate data for setting the period of the test pattern data, and control the timing of outputting the test pattern data to the device under test according to the rate data, comprising:
   a delay setting data generator operative to receive the rate data and generate delay setting data; and a variable delay circuit operative to delay the test pattern data by a delay time determined by the delay setting data with reference to a predefined unit amount of delay, wherein the rate data comprises first rate data designating the period of the test pattern data with a precision determined by the unit amount of delay and second rate data designating the period of the test pattern data with a precision higher than that determined by the unit amount of delay, and the delay setting data generator is operative to output a first value and a second value in a time division manner at a ratio determined by the second rate data, the first value being determined by the first rate data and the second value being determined by the first rate data and different from the first value, wherein the delay setting data generator includes an nth-order ΔΣ modulator for subjecting the second rate data to ΔΣ modulation, where n is a natural number, adds the sequence of ith-order bits of the second rate data thus modulated to the ith bits in the lower group of bits in the first rate data, respectively, or subtracts the ith-order bits from the ith bits, respectively, where $1 \leq i \leq n$, and outputs the resultant data as the delay setting data.

10. A method of controlling a test rate at which test pattern data is output to a device under test, based on rate data for setting the period of the test pattern data to be supplied to the device under test, wherein the rate data comprises first rate data designating the period of the test pattern data with a precision determined by the unit amount of delay and second rate data designating the period of the test pattern data with a precision higher than that determined by the unit amount of delay, and the method comprises:

setting delay setting data to be a first value and a second value in a time division manner at a ratio determined by the second rate data, the first value being determined by the first rate data and the second value being determined by the first rate data and different from the first value; and delaying the test pattern data by a delay time determined by the delay setting data with reference to a predefined unit amount of delay, wherein the setting of the delay setting data comprises:

subjecting the second rate data to n-th order ΔΣ modulation, where n is a natural number, and adding the sequence of ith-order bits of the second rate data thus modulated to the ith bits of the first rate data, respectively, or subtracts the ith-order bits from the i-th bits, respectively, where $1 \leq i \leq n$.

* * * * *